United States Patent [19]

Malhi et al.

[11] Patent Number: 5,346,835
[45] Date of Patent: Sep. 13, 1994

[54] TRIPLE DIFFUSED LATERAL RESURF INSULATED GATE FIELD EFFECT TRANSISTOR COMPATIBLE WITH PROCESS AND METHOD

[75] Inventors: Satwinder Malhi, Garland; Taylor R. Efland, Richardson; Oh-Kyong Kwon, Plano, all of Tex.

[73] Assignee: Texas Instruments Incorporated, Dallas, Tex.

[21] Appl. No.: 95,805

[22] Filed: Jul. 21, 1993

Related U.S. Application Data

[63] Continuation of Ser. No. 909,244, Jul. 6, 1992, abandoned.

[51] Int. Cl.⁵ .......................... H01L 21/266
[52] U.S. Cl. ......................... 437/41; 437/29; 437/45; 437/149; 148/DIG. 126
[58] Field of Search ............. 437/27, 28, 29, 30, 437/34, 41, 45, 148, 149, 150, 953; 148/DIG. 126

[56] References Cited

U.S. PATENT DOCUMENTS

| | | | |
|---|---|---|---|
| 4,593,458 | 6/1986 | Adler | 437/40 |
| 4,705,759 | 11/1987 | Lidow et al. | 437/149 |
| 4,798,810 | 1/1989 | Blanchard et al. | 437/29 |
| 4,904,614 | 2/1990 | Fisher et al. | 437/45 |
| 4,914,047 | 4/1990 | Seki | 148/DIG. 126 |
| 5,156,989 | 10/1992 | Williams et al. | 437/41 |

OTHER PUBLICATIONS

"High Voltage Thin Layer Devices (Resurf Devices)", J. A. Appels and H. M. J. Vaes, IEEE, 1979, pp. 238–241.

Primary Examiner—Tom Thomas
Assistant Examiner—Chandra Chaudhari
Attorney, Agent, or Firm—Jacqueline J. Garner; Richard L. Donaldson; William E. Hiller

[57] ABSTRACT

A triple-diffused lateral RESURF transistor (55,57) uses a threshold voltage adjust implant (52, 54) in conjunction with a thinner gate oxide (64) to yield a device which is more compatible with CMOS VLSI manufacturing processes and which delivers better performance characteristics than more conventional double-diffused RESURF transistor devices.

11 Claims, 6 Drawing Sheets

TRIPLE DIFFUSED LATERAL RESURF INSULATED GATE FIELD EFFECT TRANSISTOR COMPATIBLE WITH PROCESS AND METHOD

This application is a continuation, of application Ser. No. 07/909,244, now abandoned filed Jul. 6, 1992.

CROSS-REFERENCE TO RELATED APPLICATIONS

This application discloses subject matter related to the subject matter disclosed in application Ser. No. 07/776,102, now abandoned filed Oct. 15, 1991 which application has been assigned to the assignee hereof.

FIELD OF THE INVENTION

This invention relates in general to electronic power devices and more particularly to a lateral diffused insulated gate field effect transistor and processes for its fabrication.

BACKGROUND OF THE INVENTION

Lateral double diffused insulated gate field effect transistors (sometimes known as LDMOS transistors) are presently the power devices of choice for integration in very large scale integrated circuit (VLSI) logic processes. The REduced SURface Field (RESURF) design provides a better tradeoff between breakdown voltage and specific on-resistance ($r_{ds}(on)$) when compared to conventional LDMOS device designs. As built on a (p−) substrate or epitaxial layer, a RESURF n-channel LDMOS device typically will have an (n) drift region that surrounds an (n+) drain. Relatively thick LOCOS oxide is grown on a portion of the drift region. A relatively deep (p) implant is used to make a (p) body or "DWELL" which spaces the drift region from an (n+) source region that is formed within the (p) body. A (p+) back gate connection is also formed within the (p) body. A conductive gate is formed over and insulated from the (p) body to extend from the source region over the body to the lateral margin of the LOCOS oxide. This gate preferably extends onto a portion of this thicker oxide.

In order to have sufficient ruggedness in handling voltage transients and the like, RESURF LDMOS devices of the class above described conventionally employ a gate oxide thickness of more than 500 Angstroms. For MOS devices having gate oxides thicker than 500 Angstroms, gate driving voltages in excess of 12 volts are required in order to minimize specific on-resistance ($r_{sp}$). Where such gate driving voltages are necessary, the charge pumping circuitry needed to generate it occupies a relatively large area on the chip.

The 500+ Angstrom gate oxide employed in conventional RESURF LDMOS devices necessitates an oxide growth step which is different from the gate oxide growth step employed for low-power field effect transistors such as those found in VLSI logic.

Finally, conventional 500-Angstrom RESURF devices require a large $V_t$ of 1.5 to 2 Volts or more in order to be turned off under high temperature conditions and in order to have permissible levels of leakage current in their off state. A need therefore exists for a RESURF LDMOS power transistor that (1) does not require large charge pumping circuitry area, (2) employs a $V_t$ in line with other VLSI devices and (3) is formed by a process that is more compatible with VLSI processes.

SUMMARY OF THE INVENTION

In accordance with one aspect of the invention, a RESURF transistor formed at a face of a semiconductor layer of a first conductivity type such as (p). A first body of a second conductivity type opposite the first conductivity type is formed at the face of the layer. This first body includes a drift region. A thick insulator layer is formed at the face on the drift region. A second body of the first conductivity type is formed at the face of the semiconductor layer adjacent the first body. A source region of the second conductivity type is formed at the face of the semiconductor layer laterally within the second body. The second body includes a channel region between the source region and the first body. A conductive gate is insulatively disposed over the body and extends between the source region and the thick insulator layer to control the conductance of the channel region. The channel region is doped with a threshold voltage adjust dopant of the first conductivity type. Preferably, a gate insulator layer which spaces the conductive gate from the channel region is approximately 200 Angstroms thick. This makes the gate oxide formation step in the manufacture of this device compatible with a gate oxide formation step for small VLSI transistors on-chip.

According to another aspect of the invention, certain of the semiconductor process steps used in forming this RESURF transistor are shared with the process steps used in forming small VLSI devices. These preferably include a threshold voltage adjust implant step, a gate oxide formation step and a source/drain implantation step.

In the RESURF transistor described, much of the large drain voltage applied to the drain of the device is experienced across the drift region, and only a small portion of the drain voltage applies to the channel region. Therefore, a relatively thin gate oxide may be used. However, as the gate oxide thickness decreases, the channel doping needs to be increased to maintain a proper threshold. This is satisfied with the use of a threshold voltage adjust implant, which turns the transistor into a "triple diffused" device. Further, the subthreshold slope of the thin gate LDMOS devices disclosed herein is improved by this threshold adjust implant because the implant results in more uniform channel doping. The threshold voltage of the thin gate LDMOS devices can therefore be reduced from the conventional 1.5–2.5 volt value to approximately 0.8–0.85 volts.

BRIEF DESCRIPTION OF THE DRAWINGS

Further aspects of the invention and their advantages may be discerned with reference to the drawings in which like characters identify like components and in which.

DETAILED DESCRIPTION OF THE INVENTION

Figure 1:
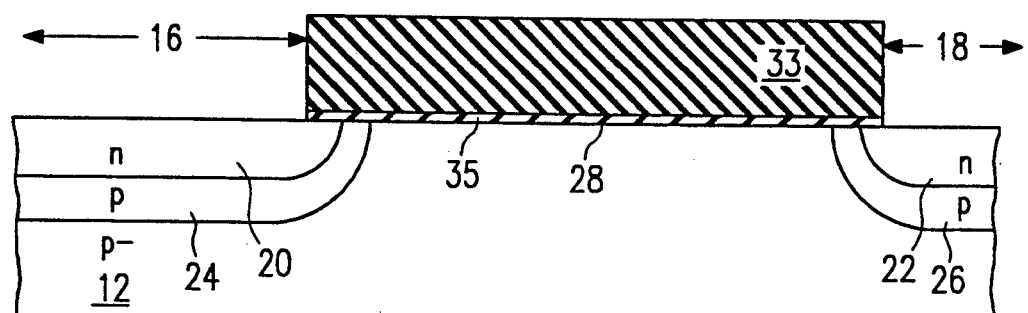
FIGS. 1–6 are highly magnified schematic cross sectional views of a pair of triple-diffused reduced surface field (RESURF) field effect transistors showing successive fabrication steps of a first process according to the invention.

Referring to FIG. 1, there is illustrated a sectional view of portions of a pair of reduced surface field (RESURF) laterally diffused transistors at an early stage of a first fabrication process according to the invention. On a semiconductor substrate (not shown) of a first conductivity type (P type is illustrated) a lightly doped (p−) epitaxial layer 12 is grown. Epitaxial layer 12 has a preferred thickness in the approximate range of 10 to 20 microns. Although the devices according to the invention are hereinafter described as being fabricated within the epitaxial layer 12, they could also be built directly on the face of a substrate.

A sacrificial oxide layer 35 is grown on the epitaxial layer 12. This oxide layer has a preferred thickness in the approximate range of 400 to 500 Angstroms. This is followed by the deposition of a layer 33 of photoresist, which is patterned. This or a prior layer or photoresist is used to define the lateral edges of oxide layer 35. The definition of mask layers 33 and 35 exposes a pair of RESURF implant areas 16 and 18, the extent of these areas being shown by the arrows. A (p) type dopant, preferably boron, is implanted into areas 16 and 18 at an implantation energy of approximately 100 KeV. The dose may be in the range of $5\times10^{12}$ atoms/cm$^2$ to $2\times10^{13}$ atoms/cm$^2$.

Using the same mask, a second implant is performed, this time using an (n) type dopant having a substantially lower diffusivity than the (p) type dopant employed above. In the preferred embodiment, arsenic is used with an implantation energy of approximately 80 KeV and a dose in the range of $5\times10^{12}$ atoms/cm$^2$ to $2\times10^{13}$ atoms/cm$^2$. After these dopants are driven in, (n) type bodies 20 and 22 will be created, as surrounded by respective (p) type dopant augmentation regions 24 and 26. Regions 20 and 22 are also known as (n) RESURF regions. Regions 24 and 26 are also known as (p) RESURF regions.

The subsequent diffusion drive-in may take place, for example at 1200° C. for approximately 700 minutes. The higher diffusivity of the boron dopant causes that dopant to diffuse outwardly at a faster rate than the arsenic atoms used to create the (n) RESURF regions 20 and 22. The greater outward diffusivity of the boron with respect to arsenic results in (p) RESURF regions 24 and 26 laterally and downwardly enclosing the respective (n) RESURF regions 20 and 22. The oxide and nitride layers are subsequently removed.

Figure 2:
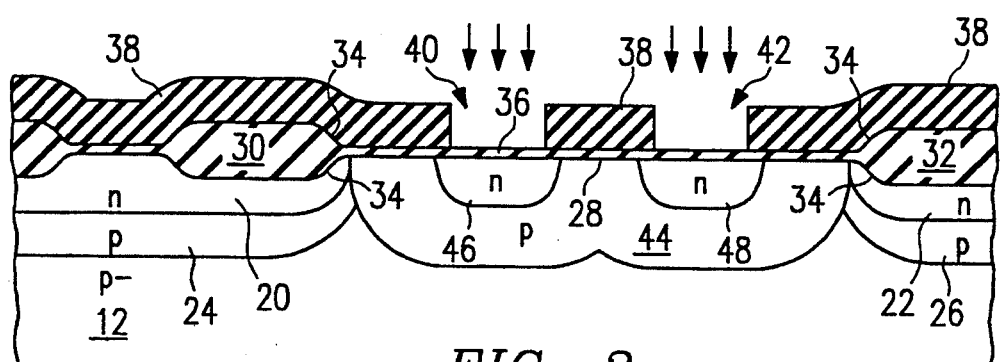

Referring next to FIG. 2, another pad oxide layer (not shown) is grown on the surface 28 of the semiconductor work-piece and a nitride layer is subsequently deposited. The pad oxide and nitride layers form a second hard mask (not shown). This hard mask is patterned and etched to leave LOCOS windows (not shown). Thereafter, LOCOS oxide islands 30 and 32 are grown under an oxide atmosphere at an elevated temperature to a thickness which preferably is about 7600 Angstroms. Each of the LOCOS oxide islands 30 and 32 has bird's beak lateral margins 34.

After the LOCOS oxidation step, the nitride mask (not shown) is removed. The pad oxide used to form the LOCOS hard mask may be left in place, or may be removed and a further pad oxide 36 may be grown in its place. A further photoresist mask 38 is then deposited and patterned to leave implantation windows 40 and 42. Two implants are performed using this patterned photoresist mask. First, a (p) type species (preferably boron) is implanted. Using boron, the implantation energy of the (p) type dopant may be approximately 100 KeV with a dose of $5\times10^{13}$ to $7\times10^{13}$ atoms/cm$^2$. This is immediately followed by the implantation of an (n) dopant having significantly less diffusivity than the (p) type dopant. In the illustrated embodiment, arsenic is used at an implantation energy of approximately 120 KeV and a dose of about $1\times10^{14}$ atoms/cm$^2$. After the outward diffusion caused in subsequent thermal steps, a (p) or DWELL body 44 will be formed that laterally and downwardly encloses each of two (n) source regions 46 and 48. The (p) body 44 laterally adjoins the (n) RESURF regions 20 and 22. The implantation step used to create (p) region 44 may also be used to form channels for lateral double diffused metal oxide semiconductor (LDMOS) transistor devices being formed on the same chip.

Figure 3:
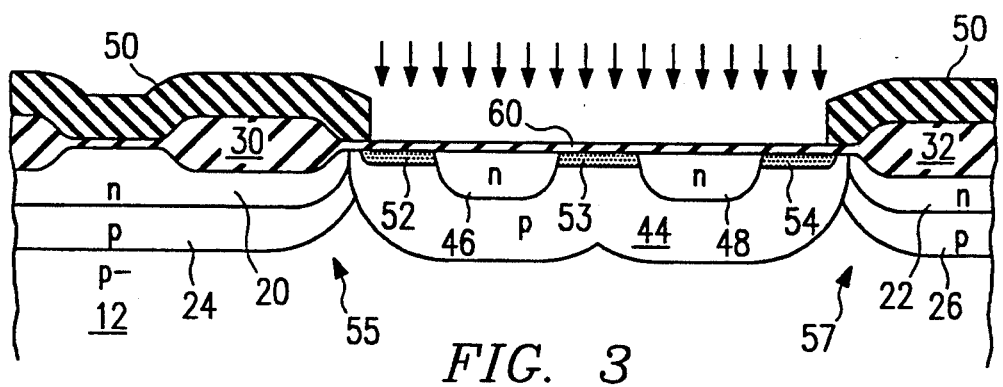

Referring next to FIG. 3, a layer 50 of photoresist is deposited and patterned and a thin gate threshold voltage adjust (TGVT) implant is implanted into the RESURF DWELL region 44. The TGVT implant is implanted into a channel region of a first RESURF transistor indicated generally at 55, which is located between the source region 46 on the one side and the (n) RESURF region 20 and LOCOS oxide region 30 on the other. The TGVT implant also is implanted into the channel region of a second, mirror-image RESURF transistor indicated generally at 57, and is located between the (n) source region 48 and the (n) RESURF region 22 and LOCOS oxide region 32. The (n) source regions 46 and 48 space the implant regions 52, 53 and 54 from each other. While in the embodiment illustrated in FIGS. 2-6 the TGVT implants take place before the deposition and etching of the polysilicon gates (described below), the process order may be changed such that the TGVT implants are done after the polysilicon gate layer has been deposited. The (p) type dopant chosen for this implantation step can be boron in either case. Where boron is used, an implantation energy about 35 KeV with a dose of 1.5 to $2.5\times10^{12}$ atoms/cm$^2$ may be employed. Where the implantation occurs through polysilicon, the implantation energy would be elevated to as much as 200 KeV, depending on the thickness of the poly layer.

Figure 3A:
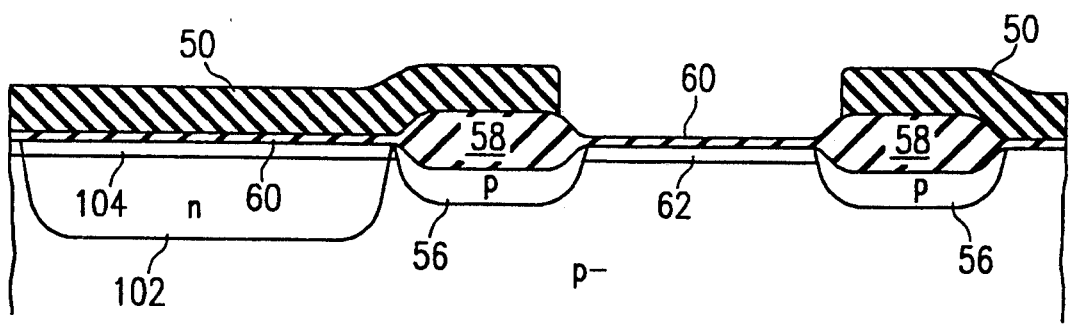
FIGS. 3a and 4a are highly magnified schematic sectional views of two stages in the fabrication of a relatively low-power field effect transistor, with FIG. 3a corresponding in time to the process step shown in FIG. 3, and FIG. 4a corresponding in time to FIG. 4.

One of the technical advantages of the invention is its ease of fabrication together with smaller, lower-power devices. Two such devices, a pair of (p) and (n) channel low-power VLSI gating transistors, are shown in FIGS. 3a and 4a. FIG. 3a is a highly magnified schematic sectional view showing a step in the process corresponding to FIG. 3. By this stage in the process, (p) channel stop regions 56 have been created followed by MOAT oxide regions 58. An (n) tank 102 has also been formed to contain the (p) channel device. After the formation of a pre-gate oxide layer 60, a (p) channel threshold voltage adjust implant is performed to create threshold voltage adjust region 104 across the face of (n) tank region 102. The active device areas for the RESURF transistor and the (n) channel device are masked off for this step. The photoresist mask masking off the RESURF transistor and the (n) channel VLSI device is then removed. The photoresist mask 50 is deposited and patterned and the TGVT implant step shown in FIG. 3 is performed to also create a threshold voltage adjust region 62. Where the threshold voltages should be different, different implants will be used at different times. The pregate oxide 60 also grows over the surface of (p) region 44 and source regions 46 and 48 in FIG. 3.

The TGVT implants into the channel regions of the RESURF transistors set the thresholds of those devices, and allows increased performance with respect to gate drive and temperature by allowing for a thin, 200 Angstrom gate oxide without the sacrifice of voltage breakdown or specific on-resistance characteristics. As will be explained below, the subthreshold characteristics are also improved, probably because of better doping uniformity.

Figure 4:
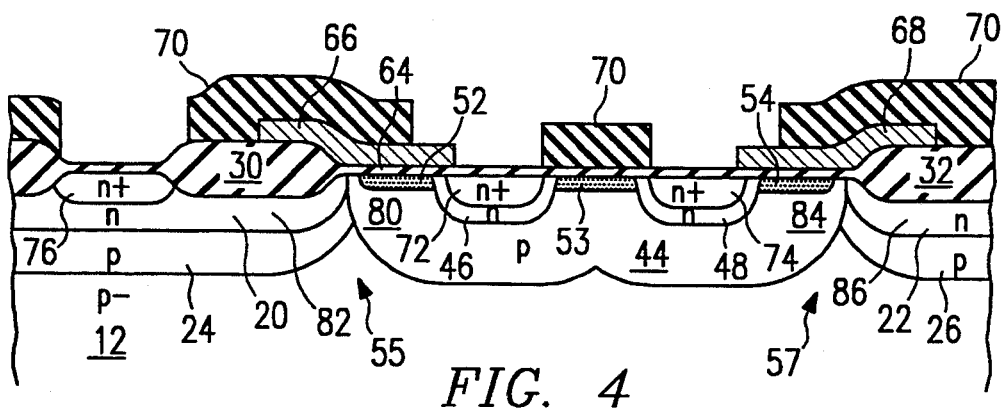
Figure 4A:
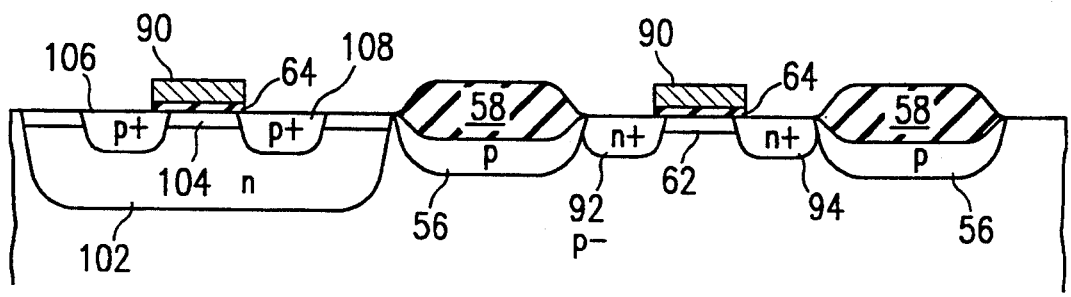

Referring next to FIG. 4, the pre-gate oxide layer 60 is removed and a gate oxide 64 is grown on exposed areas of the chip. In the illustrated embodiment, the thickness of the gate oxide 64 is 200 Angstroms, although the invention also has application to devices with thicker, 500-Angstrom gate oxides. On areas of the chip in which other high-voltage devices are formed, a 380-Angstrom oxide layer (not shown) is grown prior to the growth of the thin 200-Angstrom oxide 64 in the RESURF and low-voltage logic device areas. The RESURF and low-voltage logic device areas are protected while the 380-Angstrom oxide layer is grown. Then, when the 200-Angstrom layer 64 is grown, the 380-Angstrom layer will grow to about 500 Angstroms.

Next, a conductive gate layer (only partially shown) is formed over the entire surface of the chip. The conductive gate layer has a thickness in the approximate range of 3000 to 5000 Angstroms and preferably comprises polycrystalline silicon. It is preferably doped with $POCl_3$ to have a dopant concentration of approximately $1 \times 10^{21}$ atoms/cm$^3$ and a sheet resistance of less than or equal to about 15 ohms per square. The conductive gate layer is patterned and etched to form a polysilicon gate 66 and polysilicon gate 68. Polysilicon gate 66 extends over a channel subregion 80 of the (p) body 44. It extends further up onto the thick LOCOS oxide 30. Polysilicon gate 68 has a structure in mirror image to polysilicon gate 66, and overlies a gate subregion 84 of the (p) body 44.

The definition of the polysilicon gate 64 and 68 may be followed by a sidewall oxide process (not shown) in which sidewall oxide filaments (not shown) are formed adjacent the lateral edges of the polysilicon gates 64 and 68. Next, the poly gates, either as including the sidewall oxides or without them, are used to partially self-align an implant step involving (n) dopant. A layer 70 of photoresist is used to define those edges of the implant other than the edges defined by the poly gates 66 and 68. In this implantation step, an (n) dopant such as arsenic may be used at an implantation energy in the range of 120 to 180 KeV and a dose in the range of 4 to $5 \times 10^{15}$ atoms/cm$^2$. This implantation step forms highly doped subregions 72 and 74 of the source regions 46 and 48, with the remaining portions of source regions 46 and 48 having less of a dopant concentration but extending laterally and downwardly to a greater extent. At this time, drain regions (one for transistor 55 shown) 76 are also created to be respectively laterally and downwardly enclosed by the (n) RESURF regions 20 and 22 and to preferably be adjacent the LOCOS oxide islands 30 and 32. The (n) region 20 includes a drift region 82 which extends from the (p) region 44 to the (n+) drain 76. The (n) RESURF region 22 includes a drift region 86 which extends between the (p) body 44 and the drain region (not shown) of transistor 57. The triple-diffused source regions (72, 46) and (74, 48) produce respective graded junctions with the channel regions 80 and 84, respectively.

Figure 5:
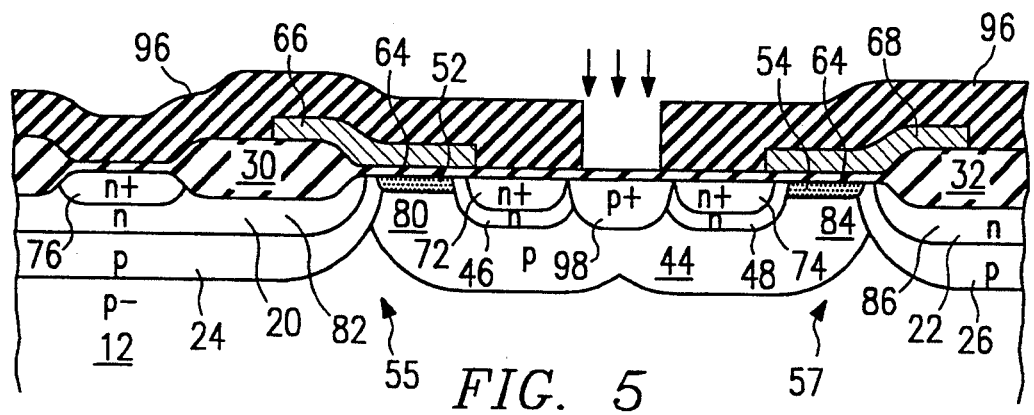

Referring to FIG. 4a, during this same period the gate oxide 64 is grown across the surface of the active device areas in which the VLSI logic transistors are being fabricated. This is followed by the deposition and doping of a layer of polycrystalline silicon which is subsequently patterned and etched to form transistor gates 90. The field oxide structures 58 and gates 90 may then be used to self-align an (n) implant for the creation of a transistor source region 92 and a transistor drain region 94. The active device area for the (p) channel device is masked off for this step. This implant may be the same implant as the one used to create RESURF (n+) source regions 72 and 74, and RESURF drain region 76. After the implantation of (n+) regions 92 and 94, the (n) channel transistor area is masked off with photoresist layer 96 (FIG. 5; not shown in FIG. 4a) and an implant is performed with a (p) type dopant to create (p+) source/drain regions 106 and 108. This implant step can be the same one which creates back gate connection region 98 (FIG. 5). The disclosed process of the invention is thus particularly compatible with the fabrication of small VLSI logic devices, as the gate oxide, gate, sources and drains may be fabricated by steps which are also used in the fabrication of the RESURF power device. The implementation of the thin-gate, triple-diffused RESURF device of the invention in a VLSI chip uses no further process steps than does a normal RESURF device, but delivers better performance.

Turning next to FIG. 5, another layer 96 of photoresist is applied to the surface of the workpiece and patterned for a (p) implant. The (p) implant may use boron as a dopant, have an implantation energy of about 25 KeV and a dose of approximately $2 \times 10^{15}$ atoms/cm$^2$. This implantation creates a back gate connection region 98 situated between the two (n+) source regions 72 and 74. The back gate connection region serves for both adjacent RESURF transistors 55 and 57. Back gate connection region 98 preferably adjoins the (n+) source regions 72 and 74 to better effect a common metal contact (not shown) to both the source region 72 and region 98 on the one hand, and source region 74 and region 98 on the other. Where the two RESURF transistors to be fabricated are to be connected and parallel, as shown a single contact may be used to span all three regions.

Figure 6:
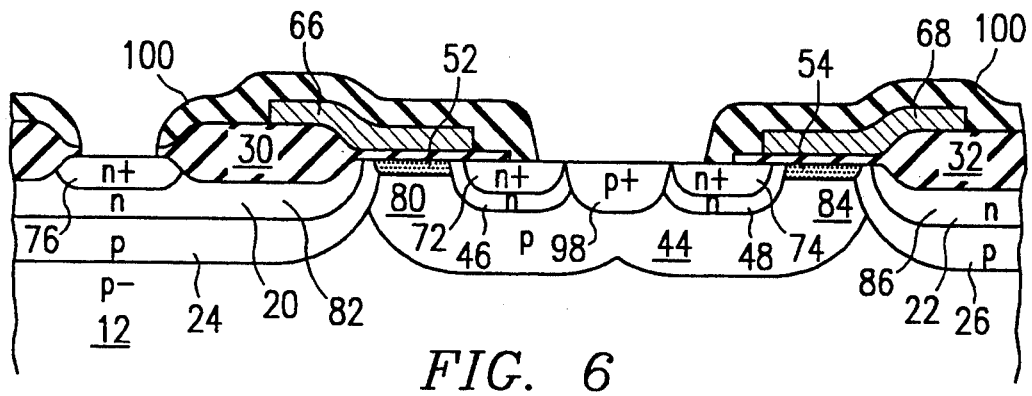

Referring next to FIG. 6, a mid-level oxide 100 is deposited and contact holes in the oxide 100 are patterned and etched. After this any one of several different metallization processes (not shown) may be applied, one of which is described below for FIG. 12.

Figure 7:
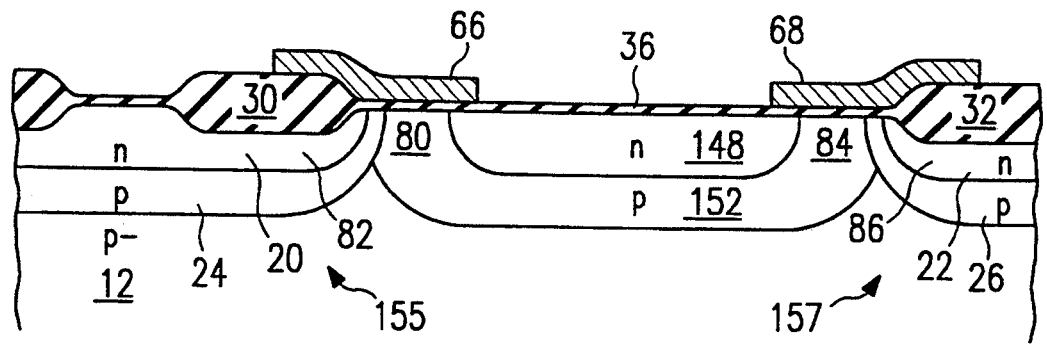
FIGS. 7–11 are highly magnified schematic sectional views of successive stages of fabrication of a pair of triple-diffused reduced surface field lateral field effect transistors showing successive steps in a second fabrication process according to the invention.

An alternative process flow is shown in FIGS. 7–11. Like characters identify like structure wherever possible. In FIG. 7, the (n) RESURF bodies 20 and 22 have already been formed together with (p) RESURF bodies 24 and 26. The (n) RESURF bodies 20 and 22 respectively include the RESURF drift regions 82 and 86 which, are disposed between the channel and drain regions of the respective devices 155 and 157. After the RESURF regions 20–26 are formed, LOCOS oxide islands 30 and 32 are grown.

A layer (not shown) of photoresist is next deposited and patterned to leave open a central implantation area well spaced away from the lateral edges of LOCOS oxide islands 30 and 32. Successive (n) and (p) type DWELL implant steps are then performed to create an (n) region 148 and a (p) DWELL region 152. As before, the (p) type material forming the DWELL 152 diffuses outward and downward at a much faster rate than the n type material used to form the (n) regions 148. A polysilicon layer is next deposited, doped, patterned and etched to form the polysilicon gates 66 and 68. As before, gate 66 and 68 each have a respective portion overlying the respective channel regions 80 and 84 of the transistors 155 and 157 of which they form respective parts, as well as a further portion which extends up onto the thick oxide 30 or 32.

In this process flow, the poly gates 66 and 68 are used to self-align an implant of (p) dopant to create a transistor body region or DWELL 152. This single self-aligned DWELL implant takes the place of the photo-aligned DWELL region 44 shown in FIGS. 2–6. Because of the high diffusivity coefficient of boron, the DWELL implant 152 will extend under the poly gates 66 and 68 to points near (but spaced from) the lateral lower edges 34 of oxide islands 30 and 32. A layer 151 of photoresist may be used to cover chip areas where the DWELL is not desirable.

Figure 8:
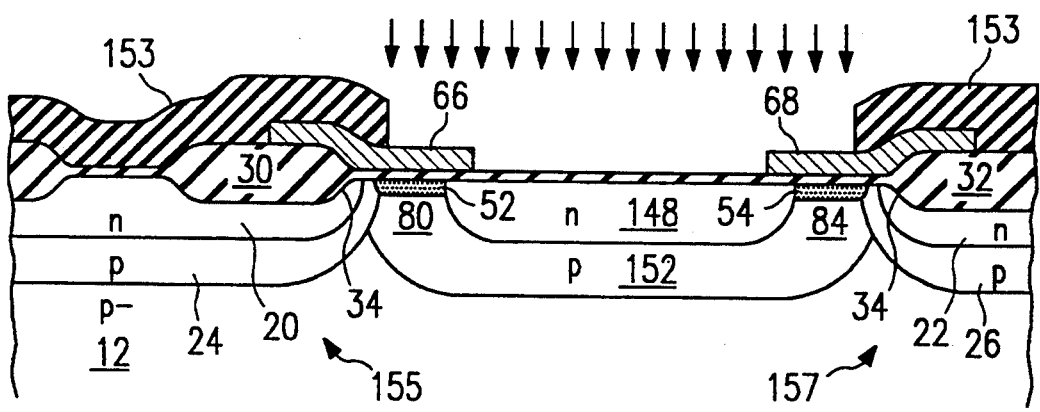

Referring next to FIG. 8, a photoresist layer 153 is deposited and patterned. A threshold voltage adjust or TGVT implant using boron or other (p) dopant is performed across the active device area and through the gates 66 and 68 and underlying gate oxide 64 to create threshold voltage adjust implant regions 52 and 54. This implant may be specified with a dose of about 1.5 to $2.5 \times 10^{12}$ cm$^{-2}$ and an energy of about 200 KeV. Photoresist layer 153 is then removed.

Figure 9:
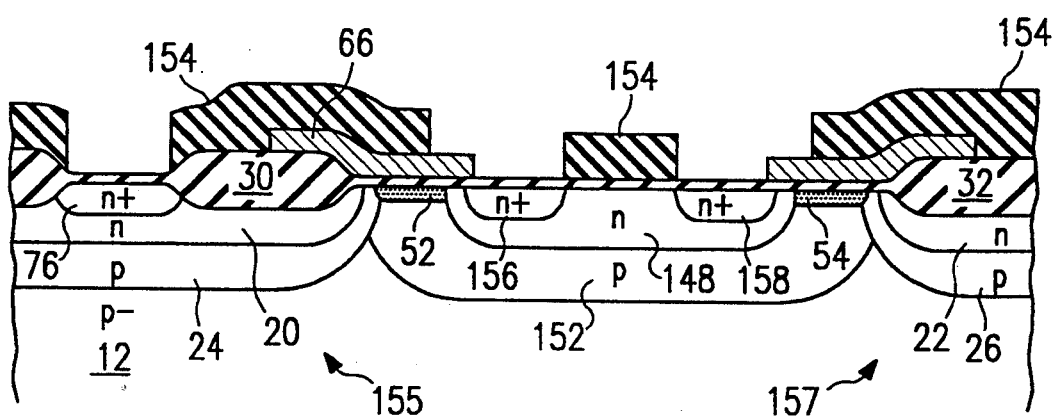

Referring now to FIG. 9, a layer 154 of photoresist is deposited and patterned to create a pair of implantation windows for partially self-aligned source implants. Arsenic or another (n) dopant is implanted into these windows to create source regions 156 and 158. These source regions are partially self-aligned to the edges of the polysilicon gates 66 and 68. The (n+) drain regions 76 are also created at this time.

Figure 10:
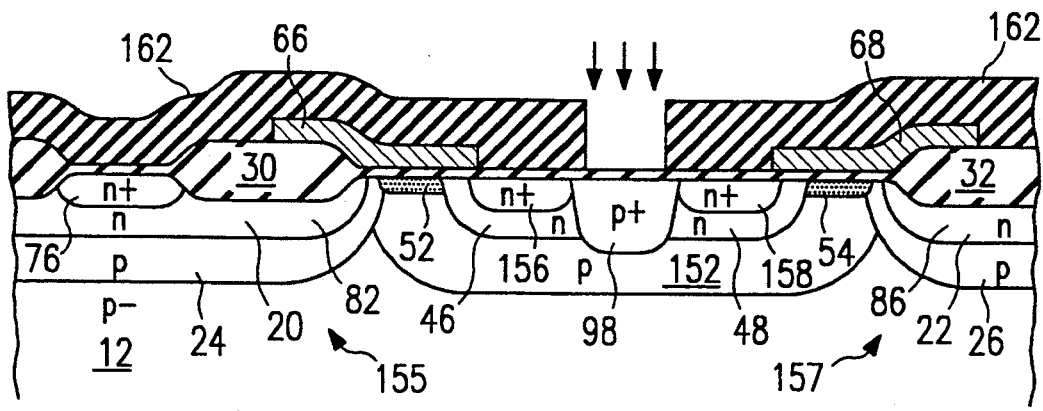

Referring next to FIG. 10, the old layer 154 of photoresist is stripped and a new layer 162 is deposited and patterned for the implantation of (p+) contact regions. Among these (p+) contact regions is the back gate connection region 98. As compared to the back gate connection region 98 shown in FIGS. 5 and 6, (p+) region in FIGS. 10–12 must go deeper to achieve good contact with the DWELL 152. This can be achieved by elevating the implantation energy and possibly the dose. The back gate connection region 98 in FIG. 10 will separate (n) region 148 into two low-density subregions 44 and 48 of the respective source regions of transistors 155 and 157.

Figure 11:
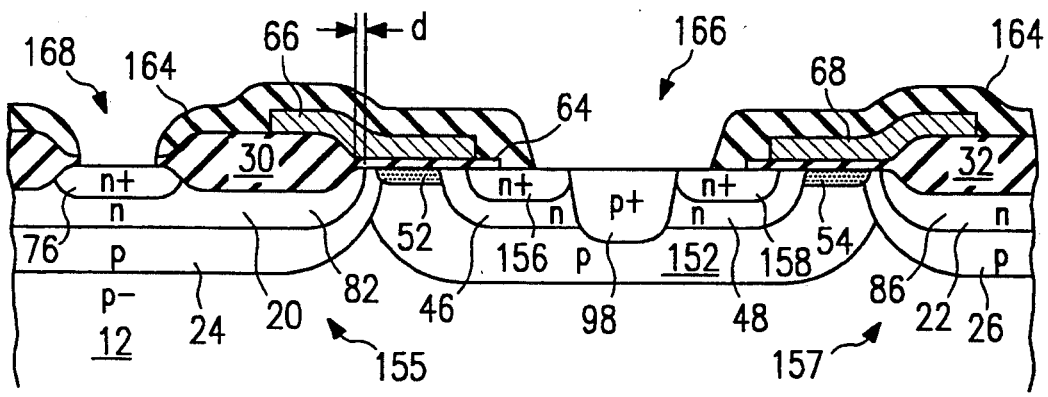

Referring to FIG. 11, the layer 162 of photoresist is stripped away and a layer of multi-level oxide 164 is deposited. Contact holes 166 and 168 are etched at the step at which other contact holes are made. Contact hole 166 provides a simultaneous contact to the back gate region 98, the source region 156 and the source region 158.

Further steps are necessary to complete the device under either process flow. The exposed contact areas are preferably silicided by depositing platinum. The deposition of platinum will create a thin layer of platinum silicide (see FIG. 12). Excess platinum is then removed. This is followed by the deposition of a relatively refractory metal such as a titanium-tungsten alloy. Aluminum is used to complete the contacts (see FIG. 12).

FIG. 11 also illustrates a distance d between the lateral margin of the (n) RESURF region 20 and the lateral margin of the thick LOCOS oxide 30. It is important to minimize distance d. The distance d must be small enough so that at the rated voltage of the device, the voltage across the gate oxide 64 is small enough to assure the long term reliability of the gate oxide 64. A principal advantage of the invention is that the gate oxide 64 can be thinned to 200 Angstroms, and even thinner as the distance d decreases with improved scaling.

Figure 11A:
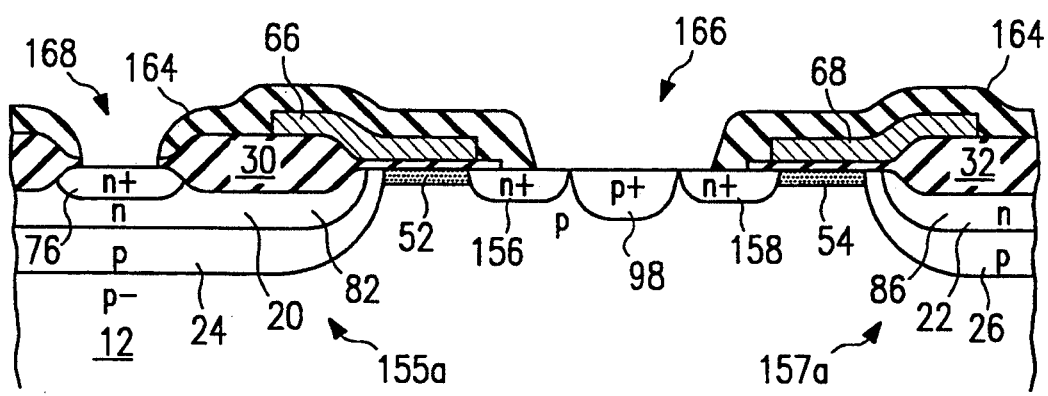
FIG. 11a is a highly magnified schematic sectional view of a RESURF transistor, illustrating another embodiment of the invention and corresponding to FIG. 11.

FIG. 11a shows a RESURF device similar to the RESURF transistor pairs shown in FIGS. 6 and 11. In FIG. 11a, there has been no single DWELL implant 152 (FIG. 11) or double DWELL implant 44 (FIG. 6). The threshold voltage of the device is therefore determined solely by the threshold adjust implant.

Figure 12:
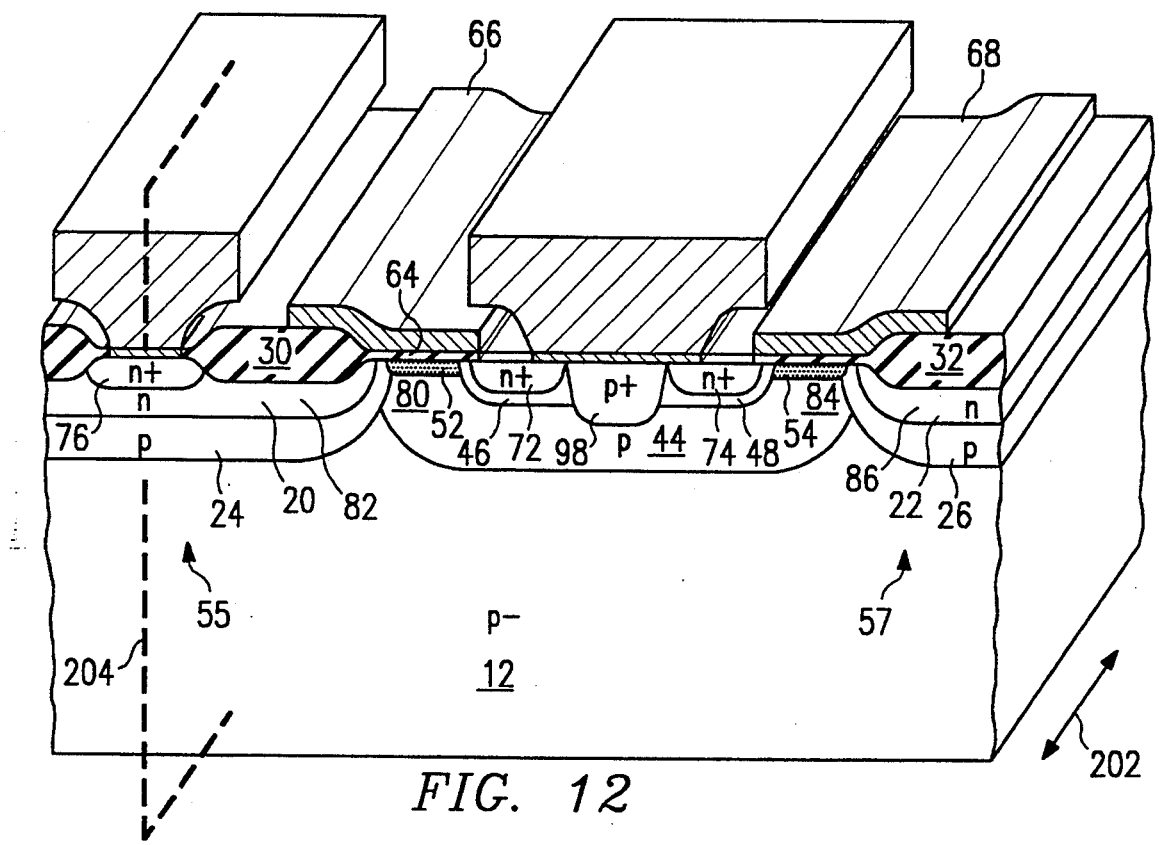
FIG. 12 is a highly magnified isometric view of a reduced surface field field effect transistor made by the process shown in FIGS. 1-6.

FIG. 12 is a highly magnified, schematic perspective view of the pair of devices shown in FIG. 6. The completed triple laterally diffused "metal/oxide/semiconductor" power transistors 55 and 57 may take any of several forms. The indicated structures may be elongated indefinitely in parallel to direction 202 to create a series of elongated stripes, as current-carrying requirements dictate. Also, the transistor 55 may be replicated about plane 204 (shown dashed) and repeated in this manner as many times as is desired to create an interdigitated transistor. With multiple sources and drains, drain region 76 would alternate with source regions 46 and 48. Only one such alternation is shown in conjunction with FIGS. 1 through 6, which shows a common back gate connection region 98 and transistor body 44 provided for two adjacent transistors.

The basic structure of transistors 55 and 57 may also have curved components (not shown) such that an essentially circular or other closed structure may be fabricated; curved components (not shown) can also close off and join together appropriate ones of the "stripes" at either end of an elongated structure.

Figure 13:
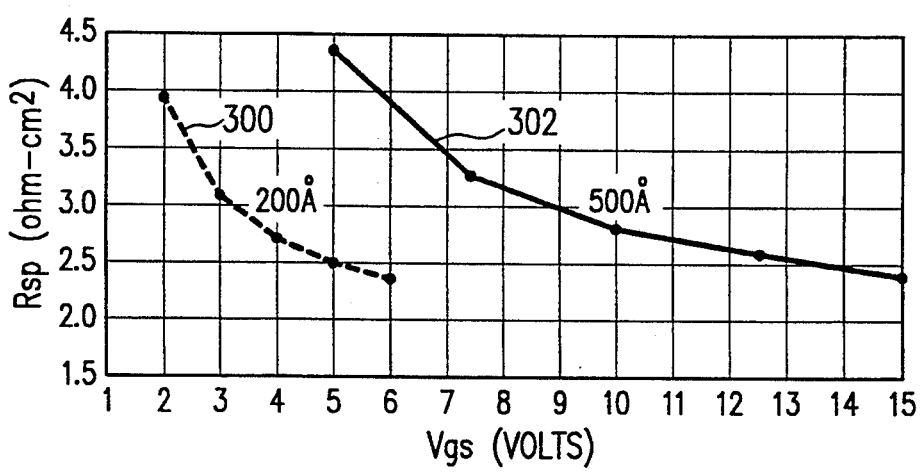
FIG. 13 is a graph of specific on-resistance ($r_{sp}$) versus gate voltage for the triple-diffused RESURF transistor of the invention and a RESURF transistor according to the prior art.
Figure 14:
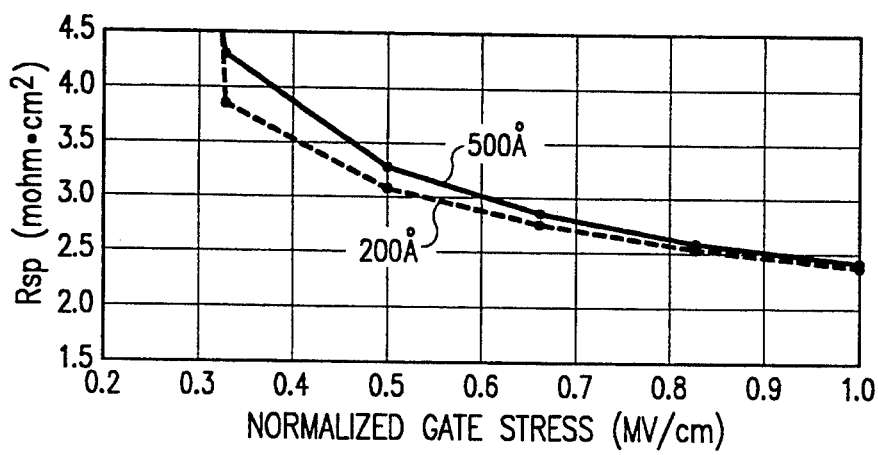
FIG. 14 is a graph of specific on-resistance ($r_{sp}$) versus normalized gate stress for the triple-diffused RESURF transistor of the invention and a RESURF transistor according to the prior art.

The present invention may be thought of as a triple diffused lateral metal/oxide/semiconductor power transistor, as opposed to its double diffused antecedents. The third diffusion is the threshold voltage adjust (TGVT) implant in the channel region of the device. FIGS. 13 and 14 show the performance benefit of the triple diffused RESURF transistor (curve 300) over a double diffused RESURF transistor (curve 302). The conventional double-diffused device is typically rated as having a 60 volt voltage breakdown between drain and source. The triple-diffused device has a rating of 80 volts. However, the triple diffused device, which has a thinner, 200 Angstrom gate oxide, nonetheless has the same specific on-resistance ($R_{sp}$) performance as the double diffused device with thicker 500 Angstrom gate oxide, and at a much lower gate drive. Curve 302 is for a device having a threshold adjust implant of boron at a dose of $2 \times 10^{12}$ cm$^2$ and an implantation energy (before poly deposition) of about 50 KeV. One technical advantage of the invention is that the triple diffused device is compatible with low voltage VLSI CMOS devices in that it may operate on five-volt power supplies without performance loss. No additional internal circuitry (such as charge pumping circuitry) is necessary to increase the gate drive for the triple diffused RESURF transistor. This allows a significant reduction in silicon area use. It also allows the use of much more standard CMOS gate drives, making the device of the invention more compatible with the large supply of existing TTL products. The triple-diffused RESURF transistor of the invention can be used very nicely even in the three volt range, making it an excellent power switch for battery-operated devices.

The above performance benefit is directly related to the lower threshold voltage of about 0.85 volts for the 200 Angstrom device. This is opposed to the higher 1.5 volt threshold of the conventional 500 Angstrom gate oxide RESURF device. The lower threshold is achieved by the threshold adjust implants.

In FIG. 14 there is shown a plot of specific on-resistance versus normalized gate stress (normalized to 3 MV) for a triple-diffused, 200 Angstrom gate oxide RESURF transistor (curve 304) and a double-diffused, 500-Angstrom gate oxide RESURF transistor (curve 306). As shown, the transistor according to the invention has $R_{sp}$ performance for the same gate stress. FIG. 14 plots the same data points as FIG. 13. Together, FIGS. 13 and 14 show that the same gate stress for 200 Angstroms requires much less gate voltage than for 500 Angstroms, yet the device performance is better.

Figure 15:
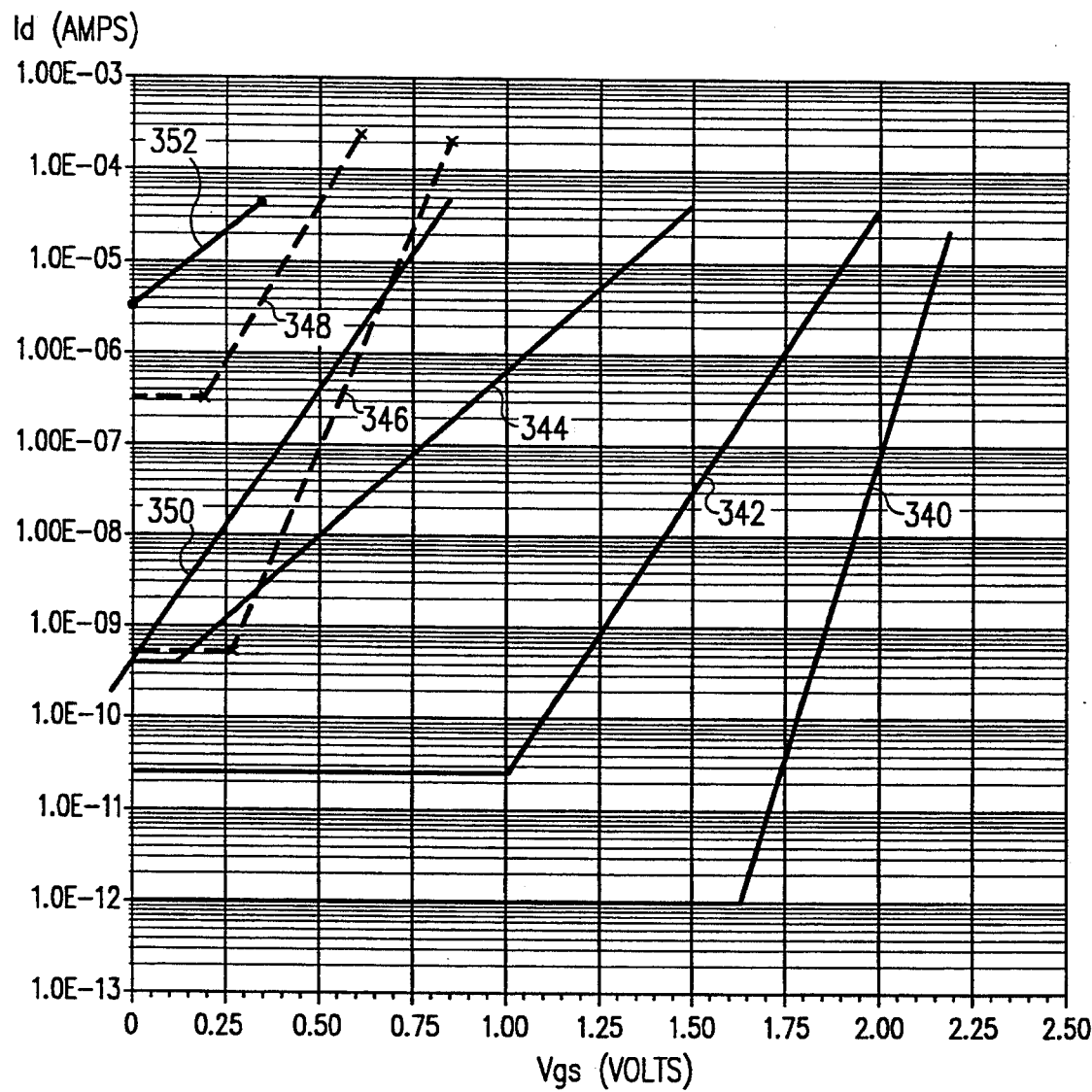
FIG. 15 is a graph of drain-to-source current on a logarithmic scale versus gate to source voltage, illustrating subthreshold voltage characteristics for a conventional and an improved triple-diffused RESURF transistor.

The combination of a thinner oxide and the use of a lower threshold voltage is an advance over existing devices using just a threshold adjust implant on a 500-Angstrom gate device. For good transistor action, it is desirable for the transistor to change from the off-state to the on-state very rapidly as the gate voltage approaches the threshold voltage. However, there is a transition region between being fully off and fully on which is referred to as the subthreshold region. The current which flows in this transition gate voltage region is called the subthreshold leakage. By plotting the subthreshold leakage on a log scale against the gate voltage, the subthreshold leakage appears to be fairly linear. Such a plot of a logarithmic scale of leakage current versus gate voltage ($V_{gs}$) is shown in FIG. 15 for a pair of devices at various temperatures. The curves illustrated are piecewise linear approximations; the real curves exhibit some hyperbolic rounding at the corners.

One often-inspected performance characteristic of transistors of this type is the change in gate drive necessary to go from an off condition to an on condition, measured in units of one over the slope of the linear region of the characteristic thus plotted. The units of this characteristic are millivolts per decades of leakage current. This quantity is generally (if somewhat erroneously) referred to as the subthreshold slope. Another important datum is the minimum current leakage at zero gate voltage. This is the intrinsic device leakage current. For a very quick off-to-on change in operation as the gate voltage increases, the subthreshold slope (as above defined) should have a very small value. In addition, in order to have a very low threshold leakage, the subthreshold slope needs to be small to avoid an undesirable high current leakage at a low gate voltage. Triple-diffused devices of the type described in this application have a much smaller threshold slope than the more conventional double-diffused devices. This smaller threshold slope is directly related to the implanted channel.

Curves 340, 342 and 344 are for a 500-Angstrom gate oxide, double diffused RESURF transistor. Curve 340 is calculated at a temperature of $-50°$ C., uses a threshold voltage of 2.233 volts. Curve 342 is drawn for a threshold voltage of 1.995 volts and a temperature of 25° C. Curve 344 is taken for a threshold voltage of 1.503 volts and a temperature of 150° C. Curves 340, 342 and 344 are for the same device.

Dashed curves 346 and 348 are for a triple-diffused, 200-Angstrom gate oxide RESURF transistor. Curve 346 is drawn for a threshold voltage of 0.85 volts at a temperature of 25° C. Curve 348 is drawn for a threshold voltage of 0.62 volts at a temperature of 150° C. The horizontal segments of each of curves 340, 342, 344, 346 and 348 represent the minimum leakage current exhibited by these devices in an "off" condition.

Curves 350 and 352 are performance characteristics of the double-diffused, 500-Angstrom gate oxide RESURF transistor for which curves 342 and 344 were drawn. Curve 350 is drawn for a voltage threshold of 0.85 volts and a temperature of 25° C. As such, it may be directly compared with curve 346. Curve 352 is drawn for a threshold voltage of 0.358 volts at a temperature of 150° C.

As can be seen in FIG. 15, the effects associated with the subthreshold region only get worse with temperature, as can be seen for plots 340, 342 and 344 taken at $-50°$ C., 25° C. and 150° C. respectively The implanted channel offers another very important performance benefit. It allows a much higher breakdown without the unwanted early breakdown effects called source-to-drain punchthrough. Punchthrough breakdown is directly related to channel doping. In order to lower the threshold of the 500 Angstrom double-diffused device, one would have to decrease the doping in the channel region. This doping decrease would also increase the probability of punchthrough breakdown. By reducing the thickness of the oxide to 200 Angstroms, the channel doping may be increased to obtain a low threshold voltage and therefore reduces the probability of punchthrough breakdown. Punchthrough is a function of depletion region extension into the channel from the drain due to the reverse bias of the drain to the back gate. When the depletion from the (n) drift region touches the depletion of the (n) source region, current will flow. This is termed punchthrough breakdown. How far the depletion region extends is inversely proportional to the channel doping concentration, with higher doping meaning less depletion.

Plot 346 shows that the 200-Angstrom, triple-diffused device has a subthreshold slope of 103 millivolts per decade at 25° C. This compares to a subthreshold slope of 160 millivolts per decade at 25° C. for the double-diffused device (plot 342). The graph shows that if the double-diffused device were translated to 0.85 volt threshold (plot 350), the device would not be off at a gate voltage of zero volts and that its current leakage would be much higher at low gate drives than the triple-diffused device. At elevated temperatures (see plot 352), the current leakage is much worse. Since the device is never off as using a $V_t$ of 0.85 volts, if a voltage were applied across the drain such as with a 12 volt automotive battery, the device would conduct. Since the triple-diffused device is off at a low gate voltage, then even with applied drain voltage the device leakage will remain fairly constant. It has been shown that for a device having a large subthreshold voltage slope, it is necessary to increase the threshold voltage to a high level to insure that the device is off at low gate voltage. The use of an increased threshold decreases performance with gate drive voltage. Therefore, the triple-diffused device as described herein has decided advantages over the double-diffused device.

As an example, assume that a car manufacturer wants to drive power windows with an H bridge product made from one of the two devices for which characteristics are illustrated in FIG. 15. The manufacturer knows that he will be driving the gate with a standard logic drive whose logic level low may be around 0.1 volt. That is, when the device is off, the gate may have as much as 0.1 volts on it. In addition, in order to get the proper power dissipation, he realizes that he will need 16,000 square mils of silicon. He also knows that between driving, sitting in hot parking lots and sitting in the garage, the vehicle will be at an average of 60° C. in a worst case. From the data provided in FIGS. 13–15 he can make the following decisions. In order to use a high threshold voltage device, he will need external circuitry to pump the gate voltage up high enough to get adequate $R_{sp}$ performance. This will add extra weight and cost to each window module. However, the car manufacturer does not need this for the triple diffused device. Looking at the performance of a 500 Angstrom double-diffused device as translated down to an 0.85 threshold voltage as shown in plot 350 he can calculate that when the double-diffused device is supposed to be off, in fact it is on. For the 16,000 mil² product, this device will burn 16 microamps of current. On the other hand, the triple-diffused device will burn 0.09 microamps, an improvement by a factor of 175. Therefore, the triple-diffused device is much better for applications such as automobiles and the like where the drain on a limited power supply (such as a car battery) is a consideration.

In summary, a novel triple-diffused RESURF transistor has been disclosed which is more compatible with CMOS logic manufacturing processes and which demonstrates superior characteristics to more conventional double-diffused devices. While the present invention and its advantages have been described in conjunction with the examples given in the above-detailed description, the invention is not limited thereto but only by the scope and spirit of the appended claims.

What is claimed is:

1. A method for the simultaneous fabrication of a reduced surface field (RESURF) lateral transistor having a drain-gate breakdown voltage in excess of forty volts and a low-power field-effect transistor in an integrated circuit, comprising the steps of:

providing a semiconductor layer having a first conductivity type;

defining first and second active device areas in the semiconductor layer, the RESURF transistor to be formed in the first active device area, the low-power transistor to be formed in the second active device area;

forming a first body of a second conductivity type opposite that of said first conductivity type at the face in the first area, the first body including a drift region;

forming a second body of the first conductivity type at the face in the first area to be laterally adjacent the first body, the second body including a RESURF channel region;

forming a first-density dopant subregion of a RESURF source region of the RESURF transistor at the face to adjoin the RESURF channel region and to be spaced from the first body;

forming a LOCOS oxide region at the face over the drift region;

simultaneously performing a threshold voltage adjust implant into the RESURF channel region and into a low-power transistor channel region in the second area;

simultaneously forming a gate insulator layer over the RESURF channel region and the low-power transistor region;

simultaneously forming a pair of conductive gates to be insulatively disposed over the RESURF channel region and the low-power transistor channel region, respectively; and simultaneously forming the following regions to be of the second conductivity type: a source region and a drain region to be spaced by the low-power transistor channel region, a RESURF drain region to be conductively connected to the drift region and spaced from the RESURF source region, and a second-density dopant subregion having a higher density than the first density of the RESURF source region to be conductively connected to the low-density dopant subregion thereof.

2. The method of claim 1, wherein said step of performing the threshold voltage adjust implant is performed prior to said step of forming the conductive gates.

3. The method of claim 1, wherein said step of performing the threshold voltage adjust implant is performed after said step of forming the conductive gates.

4. The method of claim 1, wherein the thickness of the gate insulator layer over the RESURF channel region and the thickness of the gate insulator layer over the low-power transistor channel region are the same.

5. The method of claim 1, and further comprising the steps of:

depositing and patterning a photoresist mask on the first area;

implanting the second body using the patterned mask; and implanting the first-density dopant subregion of the RESURF source region using the patterned mask.

6. A method for the simultaneous fabrication of a reduced surface field (RESURF) lateral transistor having a drain-gate breakdown voltage in excess of forty volts, and at least two low-power field-effect transistors having channel regions of opposite conductivity types, all in an integrated circuit, comprising the steps of:

providing a semiconductor layer having a first conductivity type;

defining first, second and third active device areas in the semiconductor layer, the RESURF transistor to be formed in the first active device area, a first low-power transistor to be formed in the second active device area, a second low-power transistor to be formed in the third active device area;

forming a first body of a second conductivity type opposite that of said first conductivity type at the face in the first area, the first body including a drift region;

forming a tank region of said second conductivity type to enclose the third active device area;

forming a first-density dopant subregion of a RESURF source region of the RESURF transistor at the face to be spaced from the first body by a RESURF channel region;

forming a LOCOS oxide region layer at the face over the drift region;

simultaneously performing a threshold voltage adjust implant into the RESURF channel region and into a channel region in the second active device area;

simultaneously forming a gate insulator layer over the RESURF channel region, the transistor channel region in the second area, and a transistor channel region in the third area;

simultaneously forming three conductive gates to be respectively insulatively disposed over the RESURF channel region, the channel region in the second active device area, and the channel region in the third active device area, respectively;

simultaneously forming the following regions to be of the second conductivity type: a source region and a drain region to be spaced by the channel region in the second area, a RESURF drain region to be conductively connected to the drift region and spaced from the RESURF source region, and a second-density dopant subregion having a higher density than the first density of the RESURF source region to be conductively connected to the first-density dopant subregion thereof; and simultaneously forming the following regions to be of the first conductivity type: a source region and a drain region to be spaced by the channel region in the third active device area, and a back gate connection region of the RESURF transistor to be ohmically connected to the channel region of the RESURF transistor.

7. A method of forming a transistor at a face of a semiconductor layer of a first conductivity type, comprising the steps of:

forming a first body of a second conductivity type opposite said first conductivity type formed at a face of said semiconductor layer, said first body including a drift region;

forming a first-insulator layer at said face over said drift region;

forming a second body of said first conductivity type at said face of said semiconductor layer adjacent said first body;

forming a source region of said second conductivity type at said face of said semiconductor layer laterally within said second body;

implanting a threshold voltage adjust dopant of said first conductivity type into a channel region located between said source region and said first body;

forming a second insulator layer which is thinner than the first insulator layer over said semiconductor layer;

forming a conductive gate over a portion of said second insulator layer extending between said source region and said first insulator layer; and forming a drain region of said second conductivity type at said face of said semiconductor layer within said first body adjacent said drift region and remote from said channel region.

8. The method of claim 7, wherein said second insulator layer is no more than about 200 Angstroms.

9. The method of claim 7, wherein said first conductivity type is p-type.

10. The method of claim 7, wherein said step of forming said source region comprises the steps of:

forming a first subregion having a first concentration level of a second conductivity type dopant; and forming a second subregion having a second concentration level of second conductivity type dopant, wherein said second concentration level is lower than said first concentration level.

11. The method of claim 7, further comprising the step of forming a dopant augmentation region of said first conductivity type partly surrounding and extending deeper from said face than said first body.

* * * * *